(12) United States Patent
Yi et al.

(10) Patent No.: US 6,348,730 B1
(45) Date of Patent: Feb. 19, 2002

(54) SEMICONDUCTOR DEVICE AND FABRICATING METHOD THEREFOR

(75) Inventors: Sang-Don Yi, Seoul; Byung-Soo Kim, Suwon; Chang-Hun Lee, Ansan; Soo-Cheol Lee, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/631,590

(22) Filed: Aug. 3, 2000

(30) Foreign Application Priority Data

Dec. 16, 1999 (KR) .............................................. 99-58151

(51) Int. Cl.⁷ .............................................. H01L 23/48
(52) U.S. Cl. ........................ 257/737; 257/780; 257/781
(58) Field of Search ................................ 438/613, 614; 257/737, 738, 780, 781

(56) References Cited

U.S. PATENT DOCUMENTS 5,420,073 A * 5/1995 DiGiacomo et al. ........ 438/614
5,470,787 A * 11/1995 Greer .......................... 438/614
5,767,010 A * 6/1998 Mis et al. .................... 438/614
5,773,359 A * 6/1998 Mitchell et al. ............. 439/614
5,903,058 A * 5/1999 Akram ........................ 257/778
6,107,180 A * 8/2000 Munroe et al. ............. 438/613

* cited by examiner

*Primary Examiner*—T. N. Quach
(74) *Attorney, Agent, or Firm*—Mills & Onello, LLP

(57) ABSTRACT

The present invention relates to a semiconductor device and a fabricating method therefor. According to the semiconductor device of the present invention, a phased layer of under bump metallurgy (UBM) is formed by repeatedly depositing chrome and copper layers with sputtering equipment in which chrome and copper targets are installed in singular or plural chambers. The chrome and copper layers of the phased layer are deposited in the structure of the same, thin multi-layers possible for mutual diffusion, wherein the chrome layers gradually get thinner and the copper layers gradually get thicker. As a consequence, reliability in the phased layer of the present invention is achieved with increase in the speed of depositing UBM to reduce the time and cost for all the fabricating processes of the semiconductor device.

4 Claims, 7 Drawing Sheets

SEMICONDUCTOR DEVICE AND FABRICATING METHOD THEREFOR

BACKGROUND OF THE INVENTION

1. Field of the Invention

The present invention relates to a semiconductor device, and more particularly to a semiconductor device and a fabricating method therefor which result in a reduction in time and cost for the fabricating processes and also achieve reliability in a phased layer of under bump metallurgy (hereinafter referred to as UBM).

2. Description of the Prior Art

In general, demands for high speed, high density and multi-function in electronic devices have been satisfied by advanced fabricating techniques for narrow width through reduction in the dimension of semiconductor chips and progress in integration of single elements. Accordingly, there has been a reduction in step pitch between pads of the semiconductor chip. As the step pitch has recently decreased to less than 50 microns, there is a difficulty in making electrical connections between pads using conventional wire bonding equipment. In addition, as the number of single elements per unit area increases, so do power consumption and processing delay in the semiconductor device.

In order to solve the aforementioned problems, a flip chip attachment technique has been introduced. According to the flip chip attachment technique, the conventional pad structure is modified into a new pad structure. Specifically, an opening is formed to expose a portion of a passivation layer deposited on final metal circuitry of the conventional pad structure, so that the pad is bonded with gold wire. In the flip chip attachment technique, in addition to all the conventional steps for forming the opening to expose a pad at a portion of the passivation layer deposited on the final metal circuitry, an E-beam evaporation is performed to deposit metal for UBM and solder bump, and the solder is reflowed in an atmosphere of hydrogen to modify the metal into a ball. In the course of the E-beam evaporation, masking with Mo is used such that the metal is selectively deposited for the UBM and solder.

However, there are at least two problems with such a flip chip attachment technique. The first problem is high cost for fabricating processes. That is, while selective deposition is performed with a mask of Mo, the thickness of the metal deposited for UBM is less than 1 micron, but the deposition thickness for the solder is greater than 70 microns. Therefore, there may be a great loss of deposition material in the process of the E-beam evaporation with low throughput. Furthermore, the second problem is a difficulty in controlling the resolving power of the Mo mask for reduction in the dimension of the semiconductor device. That is, in the case in which the selective deposition is performed with a Mo mask, there is no specific difficulty in forming a pattern for a pad at the mask because the dimension of the bump is greater than 100 microns according to a design rule for fabricating the bump of 0.25 micron. However, as the dimension of the bump for semiconductor devices reduces to 75 microns, there is difficulty in forming a pattern for a pad at the mask. In addition, the mask can cause a mismatch in the process of loading a wafer onto the E-beam evaporation equipment, thereby resulting in errors in the resulting pattern.

Figure 1:
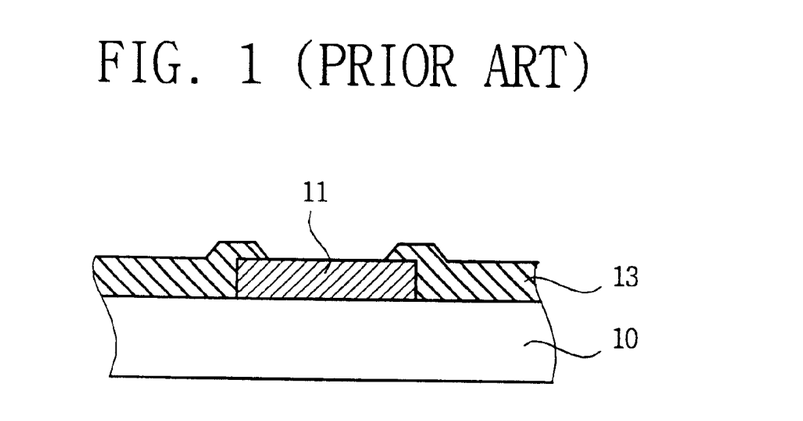
FIGS. 1 through 6 are schematic cross-sectional views illustrating fabricating processes of a semiconductor device in accordance with prior art.

In order to solve the aforementioned problem in the E-beam evaporation, there has been introduced a method of depositing UBM over the substrate and selectively electroplating solder. FIGS. 1 through 6 are schematic cross-sectional diagrams which illustrate the formation of a device using this process. As shown in FIG. 1, in accordance with this prior art fabrication method, a substrate 10 is prepared with an aluminum electrode pad 11 disposed thereon. A passivation layer 13 of oxide or nitride film is deposited along with the pad 11. An opening is formed in the passivation layer 13 to expose the pad 11. A polyimide layer (not shown) having another opening, larger than and overlapping that of the passivation layer, can optionally be additionally formed on the passivation layer 13 to relieve stress onto a lower layer of UBM, that is, a chrome layer 21, which is formed during subsequent process steps.

Figure 2:
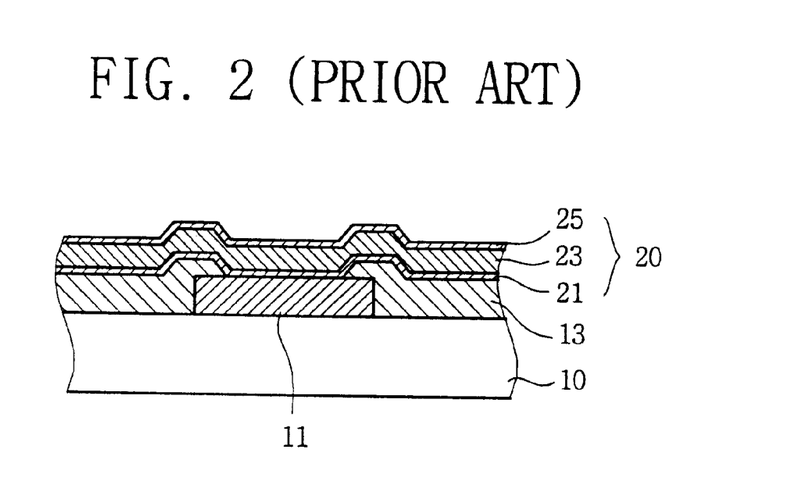
Figure 3:
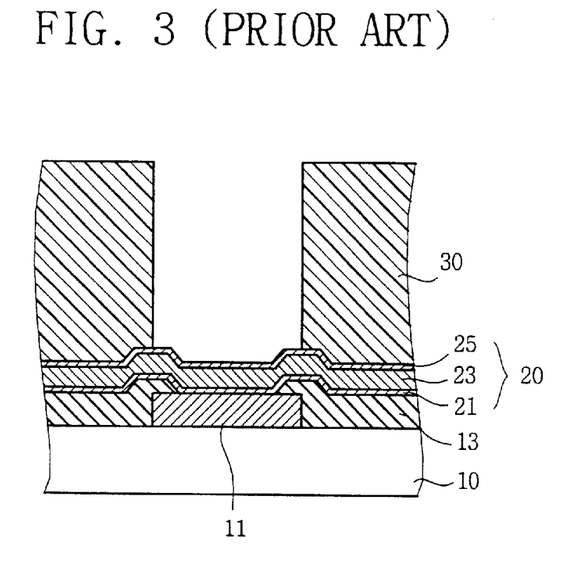
Figure 4:
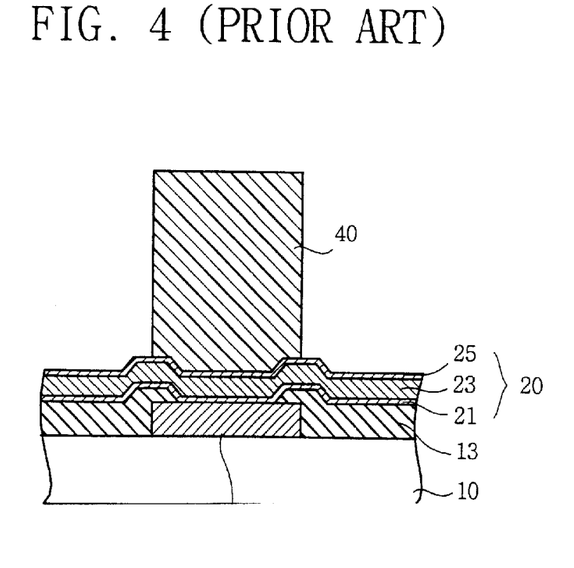
Figure 5:
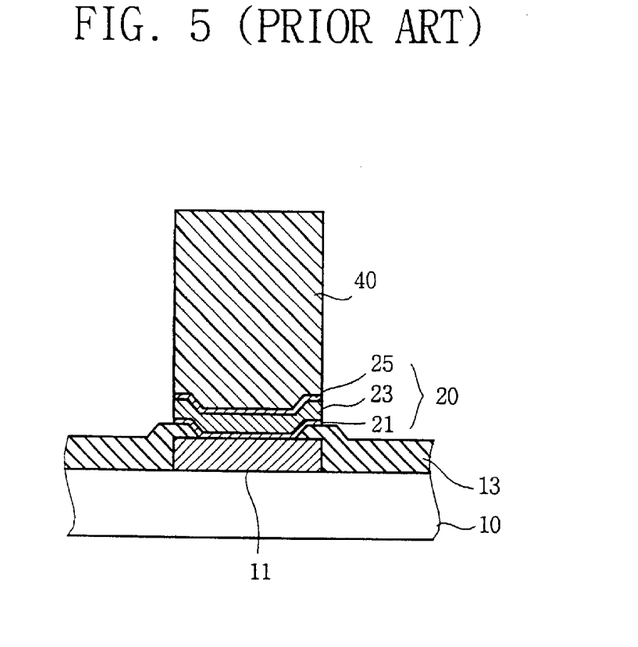
Figure 6:
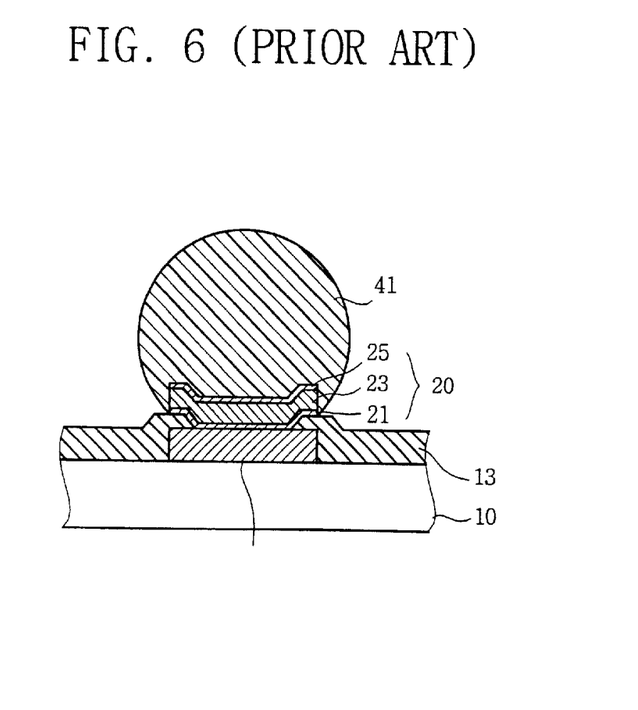

Then, as shown in FIG. 2, in order to form the UBM 20, a lower metal layer 21 of chrome and an intermediate layer including a phased layer 23 and an upper metal layer 25 of copper are deposited in sequence. Then, as shown in FIG. 3, a photoresist layer 30 is coated on the UBM 20 to prevent etching and is patterned by a lithography technique to an opening, identical or larger than that formed on the pad 11. Then, as shown in FIG. 4, the structure is electroplated with solder, and the photoresist layer 30 is removed to form a pole-type solder layer 40. The solder layer 40 can also be formed in the shape of a mushroom. Then, as shown in FIG. 5, the solder layer 40 is used as a mask to etch out the surrounding UBM 20 to expose the passivation layer 13. Finally, as shown in FIG. 6, the solder layer 40 is transformed into a solder ball 41 for a bump through a conventional re-flow process.

Figure 7:
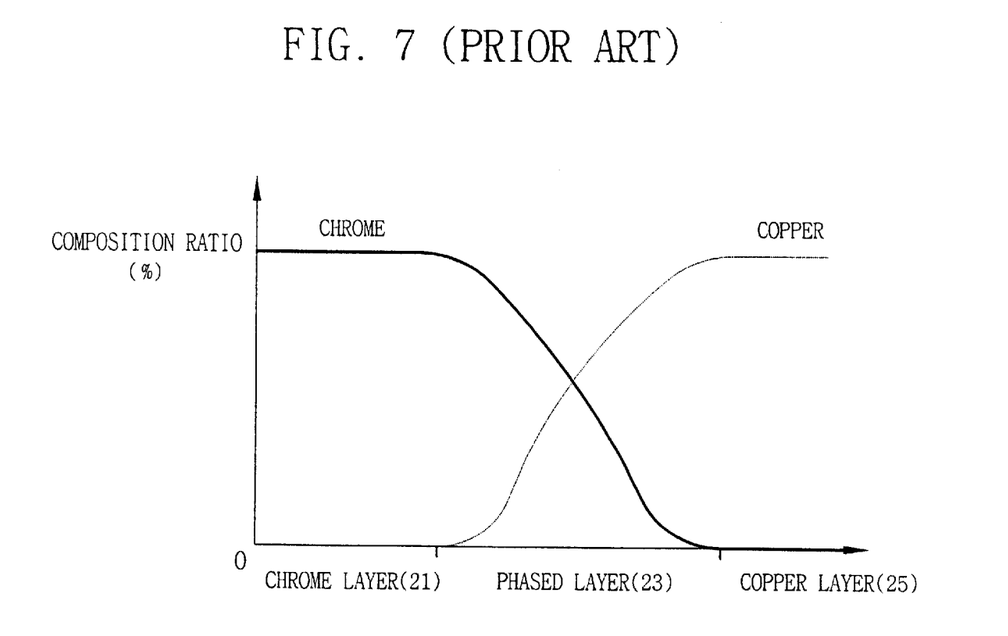
FIG. 7 is a graph illustrating a composition profile in UBM of a semiconductor device in accordance with prior art.

FIG. 7 is a graph which illustrates a composition profile in the UBM manufactureed by this process. As shown in the graph of FIG. 7, by depositing less chrome and more copper in the prior art, a reliable phased layer 23 with a favorable Auger profile (AES Profile) has been made. That is, as shown with a solid line in FIG. 7, the composition ratio of chrome is constant at 100% in the chrome layer 21. It gradually decreases in the phased layer 23 toward the copper layer 25 and becomes constant at 0% in the copper layer 25. As shown with a dotted line in FIG. 7, the composition ratio of copper is constant at 0% in the layer 21. It gradually increases in the phased layer 23 toward the copper layer 25 and becomes constant at 100% in the copper layer 25.

There is a problem in this prior art approach in that the E-beam evaporation process is performed to make the phased layer 23. This slows down the process of depositing the UBM 20, resulting in increase in operational time and cost.

In order to solve this problem in the prior art, sputtering equipment has been modified to make the phased layer of UBM. Such modified sputtering equipment is made in a double target system having internal and external targets. However,the modified sputtering equipment may bring about poor uniformity in thickness of the phased layer over the wafer and poor composition ratio between chrome and copper in the phased layer, thereby reducing reliability of the phased layer.

SUMMARY OF THE INVENTION

Therefore, it is an object of the present invention to solve the aforementioned problems and provide a semiconductor device and a device processing method to ensure a desired thickness of the phased layer of UBM to achieve reliability in uniformity.

It is another object of the present invention to provide a semiconductor device and a device processing method to increase speed in deposition of UBM and reduce cost in fabricating processes.

In accordance with the invention, there is provided a semiconductor device and a method of fabricating a semiconductor device which achieve these objects. The device of the invention includes a semiconductor substrate having a conductive electrode pad. Under bump metallurgy (UBM) is formed on the electrode pad with a first metal layer, a third metal layer and a phased layer therebetween. The phased layer includes second and fourth metal layers made of the same material as the first and third metal layers, respectively, for sequential deposition. The second metal layer gradually gets thinner from the first metal layer toward the third metal layer, and the fourth metal layer gradually gets thicker from the first metal layer toward the third metal layer. A conductive bump is formed on the UBM.

The second and fourth metal layers may be made of the same, thin multi-layers possible for mutual diffusion. Alternatively, they can be made of a mono-layer.

In one embodiment, the first and second metal layers are made of chrome, and the third and fourth metal layers are made of copper.

In accordance with another aspect of the invention, there is provided a method for fabricating a semiconductor device. A conductive electrode pad is formed on a substrate. A passivation layer is formed with an opening to expose the electrode pad in the substrate. The method includes sequentially depositing a first metal layer on the electrode pad and the passivation layer, a phased layer as an intermediate layer and a third metal layer to form UBM. The phased layer is respectively formed with the first and second metal layers of the same material and the third and fourth metal layers of the same material. The second metal layer gradually gets thinner from the first metal layer toward the third metal layer while the fourth metal layer gradually gets thicker from the first metal layer toward the third metal layer.

In one embodiment, the second and fourth metal layers are made of the same, thin multi-layers necessary for mutual diffusion. In addition, they may be made of a mono-layer.

one embodiment, the first and second metal layers are made of chrome, and the third and fourth metal layers are made of copper. The first and second layers can be made by a sputtering process with a chrome target, while the third and fourth metal layers can be made by a sputtering process with a copper target.

In consequence, there are advantages in the present invention in that a favorable, reliable phased layer can be made to reduce time and cost for fabricating UBM.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Figure 8:
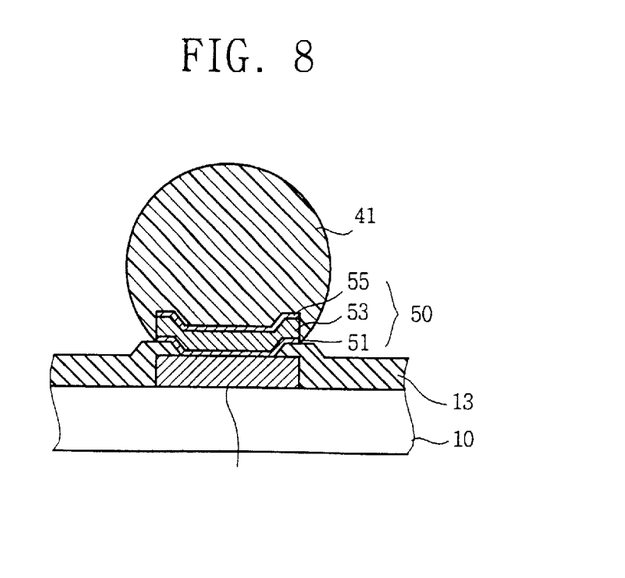
FIG. 8 is a schematic cross-sectional view illustrating one embodiment of a semiconductor device in accordance with the present invention.

FIG. 8 is a schematic cross-sectional view illustrating the structure of a semiconductor device in accordance with one embodiment of the present,invention. As shown in FIG. 8, the semiconductor device of the present invention is constructed with an electrode pad 11 of a conductive material such as aluminum on the substrate 10. A passivation layer 13 such as an oxide or nitride layer is formed as shown with an opening to expose the pad 11 in the substrate 10. The UBM 50 is sequentially deposited on the pad 11 with a first metal layer 51, an intermediate metal layer, such as a phased layer 53 and a third metal layer such as a copper layer 55. A ball-shaped solder 41 is formed as a bump on the UBM 50. Optionally, a polyimide layer (not shown) may be additionally formed on the passivation layer 13, overlapping the opening of the passivation layer 13 with another opening, larger than that of the passivation layer 13 to relieve the stress of the layer 21, a lower metal layer of UBM 20.

Figure 9:
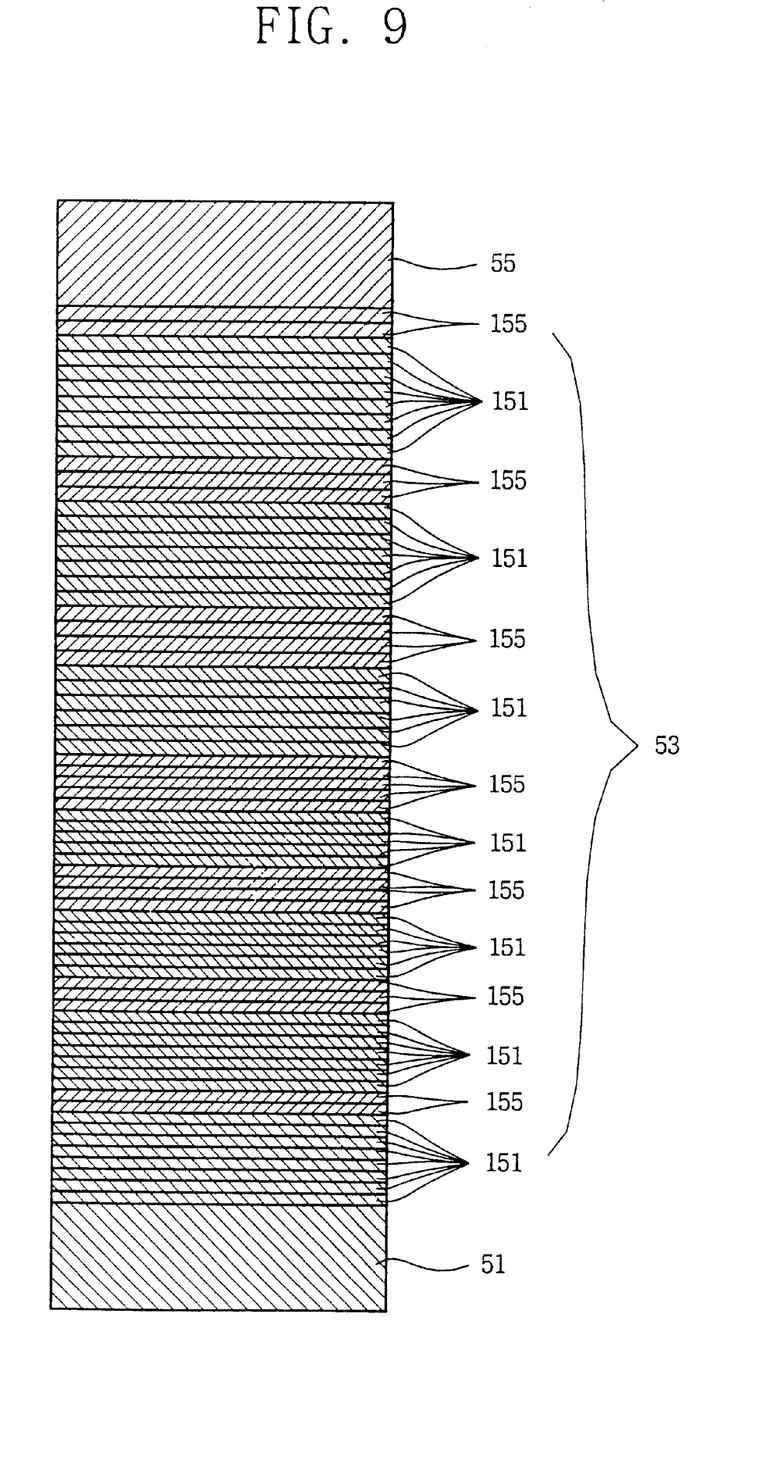
FIG. 9 is a schematic cross-sectional view illustrating a phased layer of a multi-layered structure in accordance with an embodiment of the present invention for UBM of the semiconductor device shown in FIG. 8.

FIG. 9 is a schematic detailed cross-sectional view of one embodiment of the phased layer 53 shown in FIG. 8. Referring to FIG. 9, the phased layer 53 is formed between the chrome layer 51 and copper layer 55 by repetitive deposition of the second (chrome) and fourth (copper) metal layers. The chrome layers 151 get thinner from the chrome layer 51 toward the copper layer 55, while copper layers 155 get thicker from the chrome layer 51 toward copper layer 55. The chrome and copper layers 151, 155 are constructed in the same, thin multi-layered structure possible for mutual diffusion therebetween. To describe in further detail, eight chrome layers 151, two copper layers 155, seven chrome layers 151, three copper layers 155, six chrome layers 151, four copper layers 155, five chrome layers 151, five copper layers 155, four chrome layers 151, six copper layers 155, three chrome layers 151, seven copper layers 155, two chrome layers 151, eight copper layers 155 are deposited in sequence.

Figure 11:
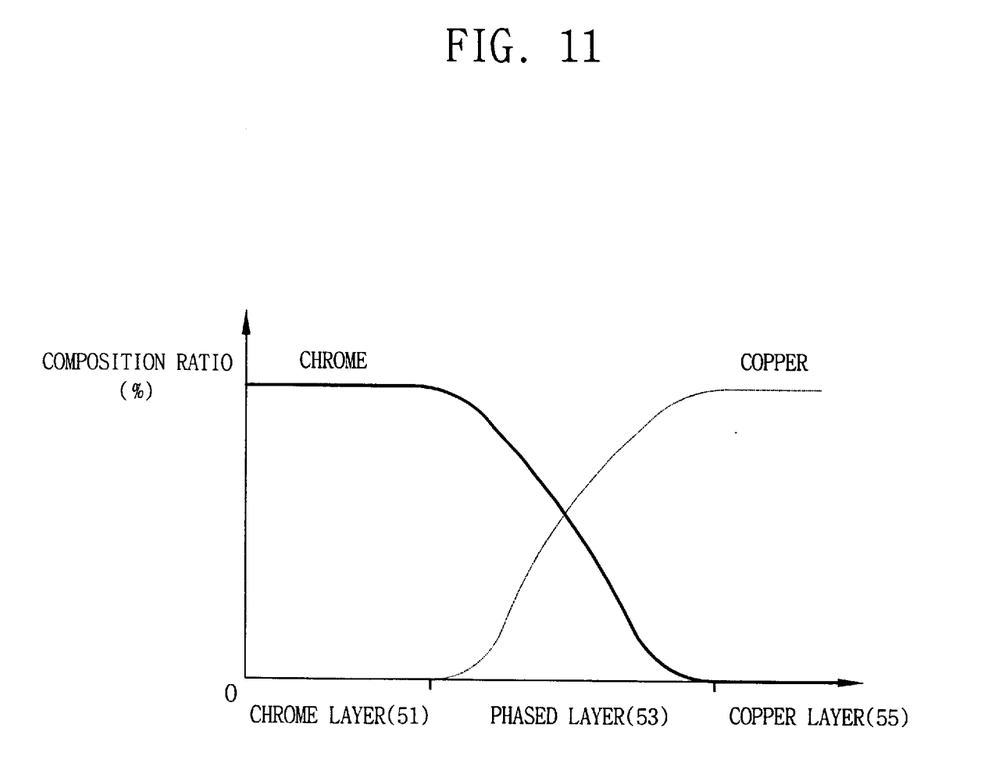
FIG. 11 is a graph illustrating a composition profile in UBM of the semiconductor device shown in FIG. 9.

In the UBM thus constructed, the reliable phased layer 53 can be made with a favorable Auger-profile (AES Profile) as shown in FIG. 11. In other words, as shown in FIG. 11, the composition ratio of chrome is shown in a solid line, remaining constant at 100% at the chrome layer 51, gradually decreasing toward the copper layer 55 in the phased layer 53 and becoming constant at 0% at the copper layer 55. On the other hand, the composition ratio of copper is shown in a dotted line, remaining constant at 0% at the chrome layer 55, gradually increasing toward the copper layer in the phased layer 53 and becoming constant 100% at the copper layer 55. Therefore, a phased layer of the UBM is deposited in a multi-layered structure to thereby achieve favorable reliability.

Figure 10:
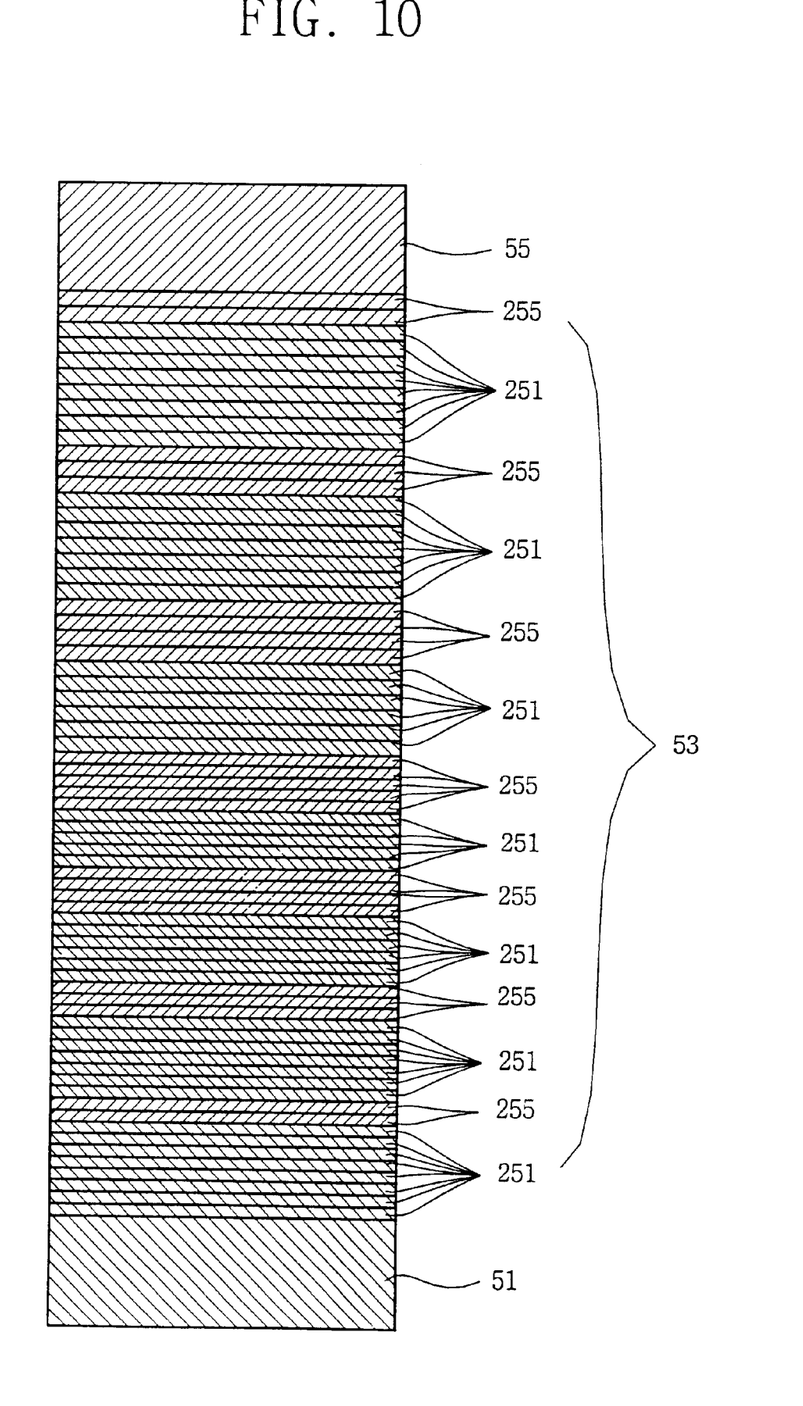
FIG. 10 is a schematic cross-sectional view illustrating a phased layer of a multi-layered structure in accordance with another embodiment of the present invention for UBM of the semiconductor device shown in FIG. 8.

As shown in FIG. 10, the phased layer 53 can also be formed between the chrome layer 51 and copper layer 55 by repetitive deposition of the second (chrome layer) and fourth (copper) metal layers 251, 255. The chrome layers 251 get thinner from the chrome layer 51 toward the copper layer 55, while copper layers 255 get thicker from the chrome layer 51 toward copper layer 55. At this time, the chrome layer 251 and copper layer 255 can also be made in a mono-layered structure.

In the UBM thus constructed, it is possible to achieve a reliable phased layer 53 with a favorable Auger-profile (AES Profile). However, in order to avoid repetition, the detailed description will be omitted.

Now, a method for fabricating a semiconductor device in accordance with the present invention will be described with reference to FIGS. 8 through 11. In accordance with the method for fabricating the semiconductor device of the present invention, a semiconductor substrate 10 is prepared with a conductive electrode pad 11 made of a material such as aluminum. A passivation layer 13 such as an oxide or nitride layer is deposited over the pad 11 and substrate 10. An opening is formed to expose the pad 11 at the passivation layer 13. A polyimide layer (not shown) having an opening, larger than that of the passivation layer and overlapping therewith, can be additionally formed on the passivation layer 13 to relieve stress onto the lower metal layer of the UBM 20, chrome layer 21, which will be formed in the following process.

Then, a lower metal layer 51, an intermediate layer such as a phased layer 53 and an upper metal layer 55 of copper are sequentially deposited along with the pad 11 and passivation layer 13 by a sputtering process. Each layer can be deposited by sputtering equipment having a plurality of chambers with chrome and copper targets. The aforementioned layers can also be deposited by the sputtering equipment having one chamber with chrome and copper targets.

The second and fourth metal layers, chrome layer 151 and copper layer 155, are repeatedly deposited. At this time, the chrome layers 151 gradually get thin from the chrome layer 51 toward the copper layer 55, while the copper layers 155 gradually get thick from the chrome layer 51 to the copper layer 55. The chrome and copper layers 151, 155 are formed in the structure of the same, thin multi-layers.

The chrome layer 51 is deposited by the chrome target onto the exposed electrode pad 11 and passivation layer 13. Then, eight thin chrome layers 151 are deposited onto the chrome layer 51 by the chrome target for mutual diffusion of chrome and copper, and two thin copper layers 155 are deposited by the copper target for mutual diffusion of chrome and copper. By the same method as described above, seven chrome layers 151, three copper layers 155, six chrome layers 151, four copper layers 155, five chrome layers 151, five copper layers 155, four chrome layers 151, six copper layers 155, three chrome layers 151, seven copper layers 155, two chrome layers 151, eight copper layers 155 are deposited in sequence.

In the UBM thus constructed, a favorable Auger-profile (AES Profile) of the completely deposited UBM 50 is shown in FIG. 11, thereby achieving favorable reliability. As shown in FIG. 11, the composition ratio of chrome is shown in a solid line, keeping constant at 100% at the chrome layer 51, gradually decreasing toward the copper layer 55 in the phased layer 53 and becoming constant at 0% at the copper layer 55. On the other hand, the composition ratio of copper is shown in a dotted line, keeping constant at 0% at the chrome layer 55, gradually increasing toward the copper layer in the phased layer 53 and becoming constant at 100% at the copper layer 55.

Alternatively, instead of forming the chrome layer 151 and copper layer 155 in the structure of the same, thin multi-layers, as shown in FIG. 10, the chrome and copper layers 251, 255 can also be repeatedly deposited as monolayer. At this time, the chrome layers 251 gradually get thin from the chrome layer 51 toward the copper layer 55, while the copper layers 255 gradually get thick from the chrome layer 51 to the copper layer 55.

Then, a ball shaped solder 41 is formed on the UBM pattern by the conventional method to thereby complete all the processes of the present invention. Therefore, the UBM of the present invention is deposited in the multi-layered structure by the sputtering process to thereby achieve a favorable, reliable phased layer, and the speed of depositing UBM to reduce the time and cost necessary for all the fabricating processes.

As described above, in accordance with the semiconductor device and the method therefor of the present invention, the phased layer of UBM is formed by repeatedly depositing chrome and copper layers with the sputtering equipment in which chrome and copper targets are installed in singular or plural chambers. At this time, the chrome and copper layers of the phased layer are deposited in the structure of the same, thin multi-layers possible for mutual diffusion, wherein the chrome layers gradually get thinner and the copper layers gradually get thicker.

As a result, there is an advantage in the present invention in that the reliability in the phased layer of the UBM is achieved and the speed of depositing UBM increases to reduce the time and cost for all the fabricating processes of the semiconductor device. While the invention has been described in terms of a preferred embodiment, those skilled in the art will recognize that the invention can be practiced with various modifications within the spirit and scope of the appended claims.

While this invention has been particularly shown and described with references to preferred embodiments thereof, it will be understood by those skilled in the. art that various changes in form and details may be made therein without departing from-the spirit and scope of the invention as defined by the following claims.

What is claimed is:

1. A semiconductor device comprising:
   a semiconductor substrate having formed thereon a conductive electrode pad;
   under bump metallurgy (UBM) formed on the electrode pad with a first metal layer, a third metal layer and a phased layer therebetween, in which second and fourth metal layers are respectively made of the same material as the first and third metal layers for sequential deposition, wherein the second metal layer gradually gets thinner from the first metal layer toward the third metal layer and the fourth metal layer gradually gets thicker from the first metal layer toward the third metal layer; and
   a conductive bump formed on the UBM.

2. The device as defined in claim 1, wherein the second and fourth metal layers are made of thin multiple layers for mutual diffusion.

3. The device as defined in claim 1 wherein the second and fourth metal layers are each made of a single layer.

4. The device as defined in claim 1, wherein the first and second metal layers are made of chrome, and the third and fourth metal layers are made of copper.

* * * * *